(12) United States Patent
Wei et al.

(10) Patent No.: US 8,300,409 B2
(45) Date of Patent: Oct. 30, 2012

(54) FAN DUCT FOR ELECTRONIC COMPONENTS OF ELECTRONIC DEVICE

(75) Inventors: Chao-Ke Wei, Taipei Hsien (TW); Yao-Ting Chang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 218 days.

(21) Appl. No.: 12/857,487

(22) Filed: Aug. 16, 2010

(65) Prior Publication Data

US 2011/0317359 A1 Dec. 29, 2011

(30) Foreign Application Priority Data

Jun. 23, 2010 (TW) ................................ 99120362 A

(51) Int. Cl.
*H05K 7/20* (2006.01)
(52) U.S. Cl. ......... 361/690; 361/689; 361/691; 454/184
(58) Field of Classification Search .................. None
See application file for complete search history.

(56) References Cited

U.S. PATENT DOCUMENTS

| | | | | |
|---|---|---|---|---|
| 5,077,601 | A * | 12/1991 | Hatada et al. | 257/722 |
| 5,734,551 | A * | 3/1998 | Hileman et al. | 361/695 |
| 5,914,857 | A * | 6/1999 | Johnson et al. | 361/690 |
| 6,678,157 | B1 * | 1/2004 | Bestwick | 361/695 |
| 7,167,363 | B1 * | 1/2007 | Cushman et al. | 361/694 |
| 7,342,786 | B2 * | 3/2008 | Malone et al. | 361/695 |
| 7,542,289 | B2 * | 6/2009 | Tsai et al. | 361/695 |
| 7,817,417 | B2 * | 10/2010 | Franz et al. | 361/679.51 |
| 7,983,045 | B2 * | 7/2011 | Bhattacharya et al. | 361/707 |
| 2008/0062644 | A1 * | 3/2008 | Petroski | 361/695 |

* cited by examiner

*Primary Examiner* — Boris Chervinsky
(74) *Attorney, Agent, or Firm* — Altis Law Group, Inc.

(57) ABSTRACT

A fan duct includes a top plate, two side plates extending downward from opposite sides of the top plate, and plural guiding plates extending downward from the top plate. The side plates and the top plates cooperatively define an air inlet and an air outlet. The air inlet and the air outlet are located at another two opposite sides of the top plates, respectively. The guiding plates are located between the side plates and adjacent to the air outlet. Each of the guiding plates forms a guiding face facing the air inlet. The guiding face is obliquely oriented with respect to the top plate. An electronic device incorporating the fan duct is also provided.

19 Claims, 6 Drawing Sheets

US 8,300,409 B2

FAN DUCT FOR ELECTRONIC COMPONENTS OF ELECTRONIC DEVICE

BACKGROUND

1. Technical Field

The disclosure relates to heat dissipation, and particularly to a fan duct for guiding airflow to cool memory cards of an electronic device.

2. Description of Related Art

With the continuing development of electronics technology, components of electronic devices, such as memory cards, generate much heat. The heat needs to be dissipated immediately to ensure the continued proper functioning of the electronic device. Generally, a cooling fan is provided to generate airflow, and a fan duct is provided to guide the airflow. However, a gap often exists between the electronic component and the fan duct. The gap provides a relatively low flow resistance, and a portion of the airflow may be diverted through the gap. As a result, the cooling efficiency of the cooling fan is reduced.

What is needed, therefore, is a fan duct which can overcome the limitations described.

DETAILED DESCRIPTION

Figure 1:
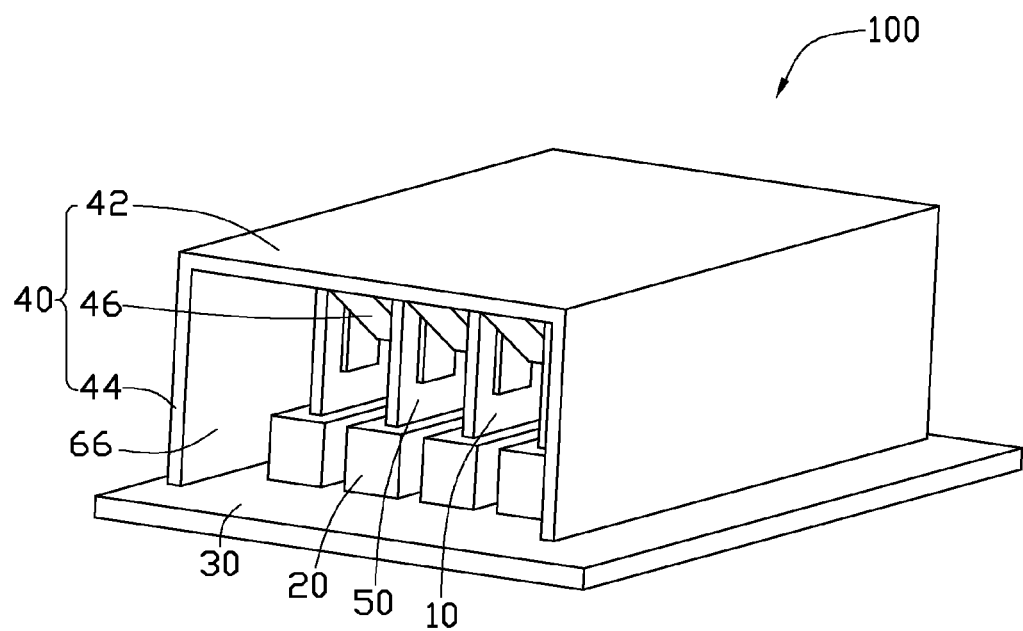
FIG. 1 is an isometric, assembled view of an electronic device with a fan duct in accordance with a first exemplary embodiment of the disclosure.

Referring to FIG. 1, an electronic device 100 with a fan duct according to a first exemplary embodiment is shown. The electronic device 100 includes a circuit board 30, a plurality of sockets 20 formed on the circuit board 30, a plurality of electronic components, such as memory cards 10 shown in this embodiment, coupled to the sockets 20, a cooling fan (not shown) for generating airflow, and a fan duct 40 for guiding the airflow to the memory cards 10.

Figure 2:
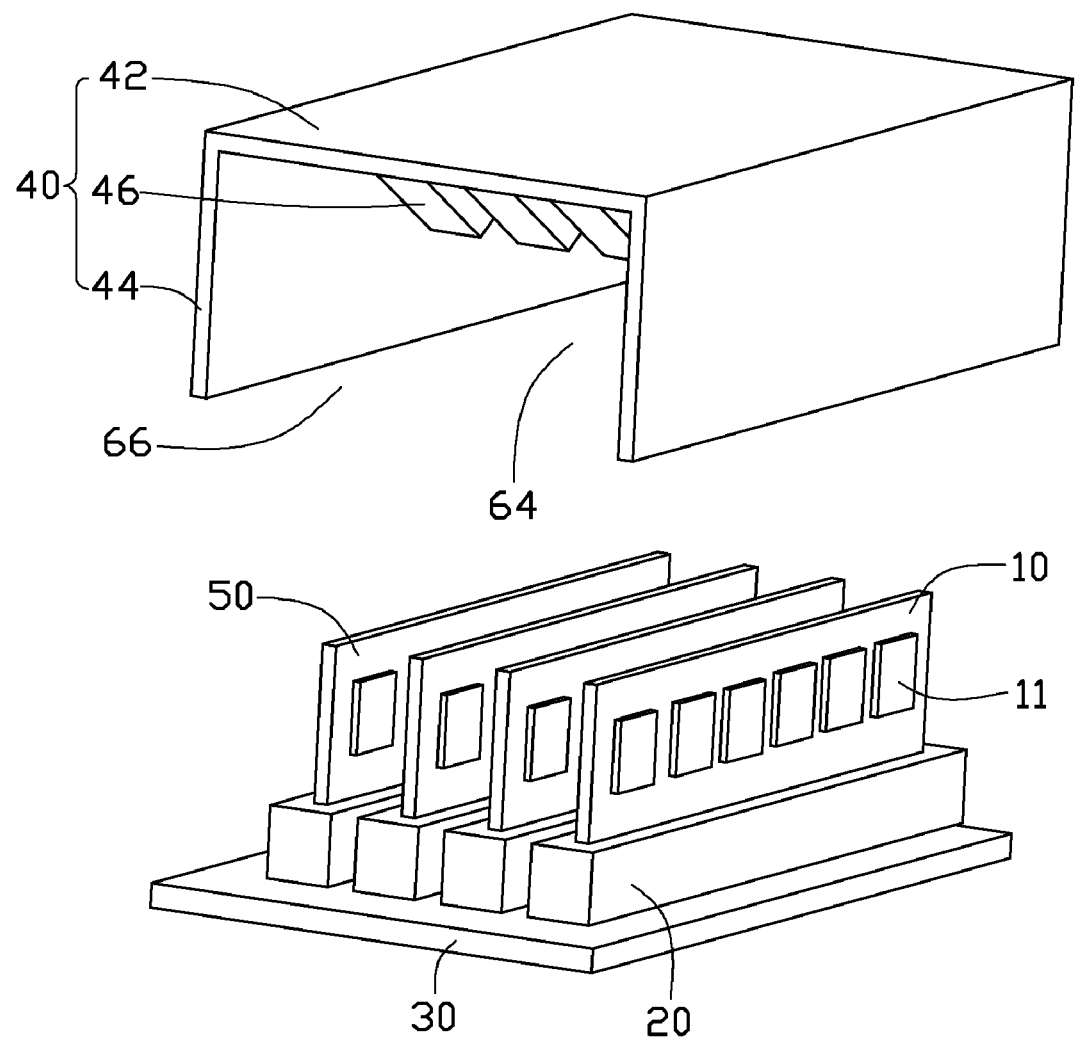
FIG. 2 is an exploded view of the electronic device of FIG. 1.

Referring also to FIG. 2, in this embodiment, only four sockets 20 are shown. Each of the sockets 20 is elongated. The sockets 20 are parallel to and spaced from each other. Four memory cards 10 couple to the four sockets 20, respectively. The memory cards 10 are elongated and parallel, with a channel 50 defined between each two neighboring memory cards 10. Chips 11 of each memory card 10 are evenly distributed along a longitudinal axis of the memory card 10.

Figure 3:
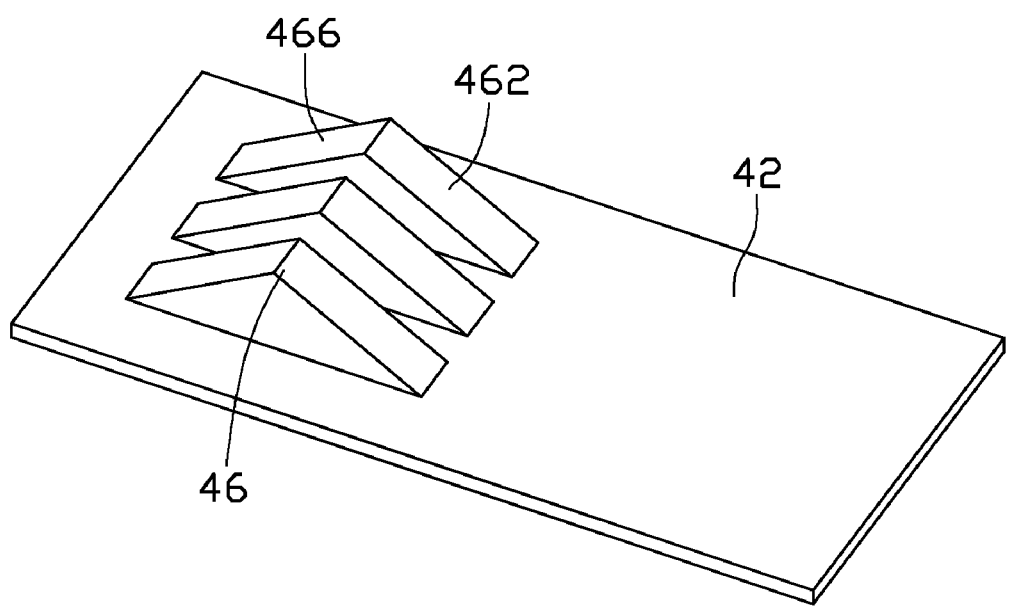
FIG. 3 is an inverted view of the fan duct of the electronic device of FIG. 1, but with side plates of the fan duct omitted.

Referring also to FIG. 3, the fan duct 40 is arranged on the circuit board 30, and covers the memory cards 10. The fan duct 40 includes a top plate 42, two side plates 44, and a plurality of guiding plates 46. The top plate 42 is rectangular and elongated, longer than the memory cards 10, and wider than an area occupied by the sockets 20 to which the memory cards 10 are coupled.

Figure 4:
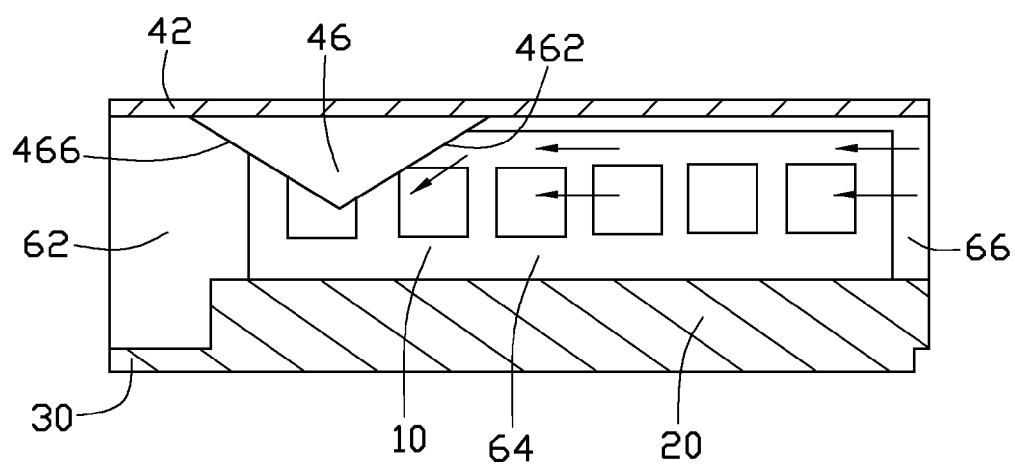
FIG. 4 is a schematic cross section showing airflow in the electronic device of FIG. 1.

The side plates 44 extend downward from opposite lateral edges of the top plate 42, respectively. The side plates 44 are parallel to each other and to the memory cards 10, and are taller than the memory cards 10. A space 64 is defined in the fan duct 40 among the side plates 44 and the top plate 42. Referring also to FIG. 4, an air inlet 66 and an air outlet 62 are defined at opposite ends of the fan duct 40, respectively. In this embodiment, the air inlet 66 is defined among front ends of the side plates 44 and the top plate 42, and the air outlet 62 is defined among rear ends of the side plates 44 and the top plate 42. The air inlet 66 and the air outlet 62 each communicate with the space 64 of the fan duct 40.

The guiding plates 46 extend downward from an end of the top plate 42 adjacent to the air outlet 62. The guiding plates 46 are parallel to each other, and are evenly distributed between the side plates 44. In this embodiment, three guiding plates 46 are provided, and each guiding plate 46 corresponds to one of the channels 50 between the memory cards 10. Each of the guiding plates 46 has a triangular cross section parallel to the side plates 44.

Each guiding plate 46 includes a guiding face 462 facing the air inlet 62, and a rear face 466 facing the air outlet 62. Both the guiding face 462 and the rear face 466 are rectangular. The guiding face 462 and the rear face 466 obliquely extend from the top plate 42, and intersect each other at a bottom of the guiding plate 46. An angle defined between the guiding face 462 and the top plate 42 is between 90° and 180°.

When the electronic device 100 is assembled, the fan duct 40 is coupled to the memory cards 10, with the top plate 42 disposed over the memory cards 10 and the side plates 44 connected to the circuit board 30 at a periphery of the memory cards 10. The memory cards 10 are entirely received in the space 64 of the fan duct 40, with top ends of the memory cards 10 spaced a narrow distance from the top plate 42 of the fan duct 40. The air inlet 66 of the fan duct 40 is located at the front ends of the memory cards 10, and the air outlet 62 of the fan duct 40 is located at the rear ends of the memory cards 10. The guiding plates 46 extend into the channels 50 of the memory cards 10, respectively. Preferably, a height of the portion of each guiding plate 46 extending into the channel 50 is about ⅓ to ½ of the height of the memory cards 10.

During operation of the memory cards 10, a large amount of heat is generated by the chips 11 thereof. Air from the cooling fan flows into the space 64 of the fan duct 40 via the air inlet 66, and then flows along the channels 50 to leave the fan duct 40 via the air outlet 62. As shown in FIG. 4, when the airflow encounters the guiding faces 462 of the guiding plates 46 of the fan duct 40, the airflow is guided downward towards bottoms of the memory cards 10, thereby enhancing heat exchange. That is, more heat of the memory cards 10 can be removed by the airflow, and the memory cards 10 can be maintained at a lower temperature.

Figure 5:
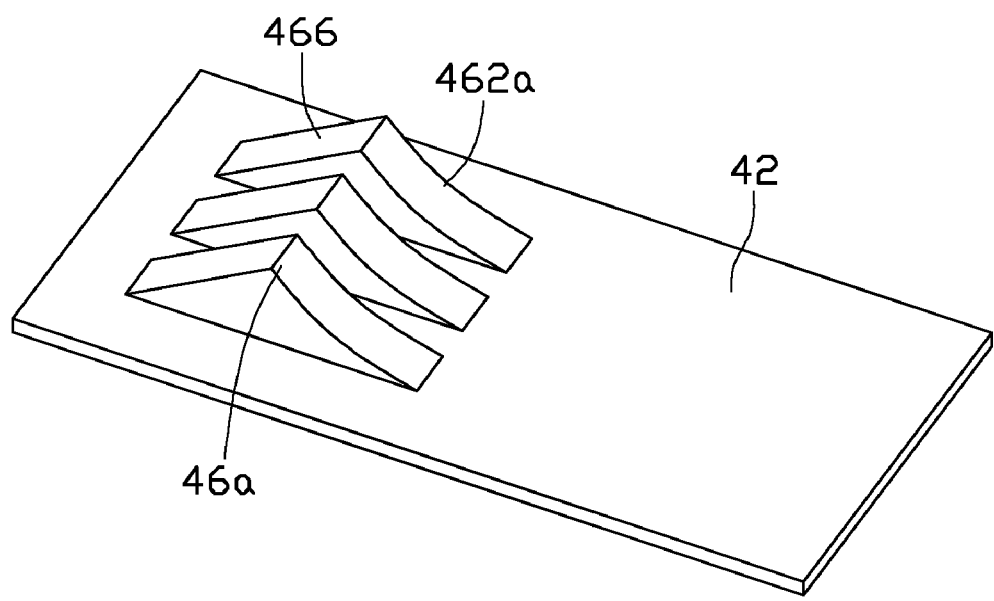
FIG. 5 is similar to FIG. 3, but shows a fan duct of a second exemplary embodiment of the disclosure, with side plates of the fan duct omitted.

FIG. 5 shows part of a fan duct according to a second exemplary embodiment. The fan duct differs from the previous embodiment only in the shape of guiding faces 462a of guiding plates 46a thereof. In this embodiment, each of the guiding faces 462a is concave.

Figure 6:
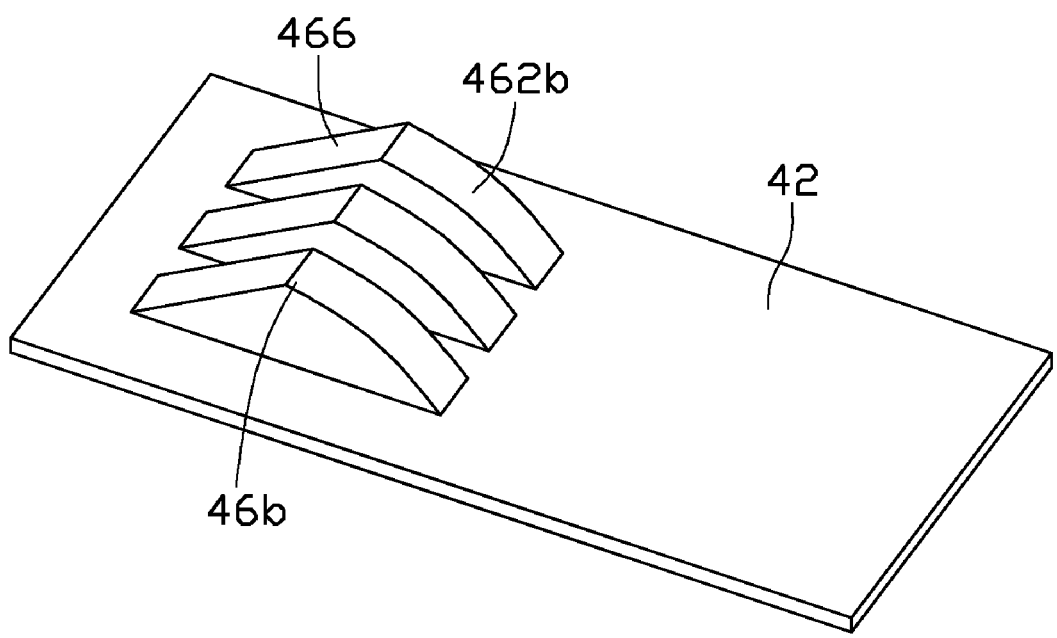
FIG. 6 is similar to FIG. 3, but shows a fan duct of a third exemplary embodiment of the disclosure, with side plates of the fan duct omitted.

FIG. 6 shows part of a fan duct according to a third exemplary embodiment. The fan duct differs from the previous embodiments only in the shape of guiding faces 462b of guiding plates 46b thereof. In the third exemplary embodiment, each of the guiding faces 462b is convex.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A fan duct, comprising:
   a top plate;
   two side plates extending downward from opposite sides of the top plate, the side plates and the top plate cooperatively defining an air inlet and an air outlet, the air inlet and the air outlet located at another two opposite sides of the top plate, respectively; and
   a plurality of guiding plates extending downward from the top plate, the guiding plates located between the side plates and adjacent to the air outlet, each of the guiding plates forming a guiding face facing the air inlet and a single, smoothly continuous rear face facing the air outlet, the guiding face obliquely oriented with respect to the top plate, and the rear face extending aslant directly from the top plate and intersecting the guiding face at a bottom of the guiding plate.

2. The fan duct of claim 1, wherein the guiding plates are parallel to and evenly distributed between the side plates.

3. The fan duct of claim 1, wherein an angle formed between the guiding face and the top plate is between 90° and 180°.

4. The fan duct of claim 1, wherein the guiding face is planar.

5. The fan duct of claim 4, wherein the guiding face is rectangular.

6. The fan duct of claim 1, wherein the guiding face is concave.

7. The fan duct of claim 1, wherein the guiding face is convex.

8. The fan duct of claim 1, wherein a bottom of the guiding plate is higher than bottoms of the side plates.

9. The fan duct of claim 1, wherein each of the guiding plates has a triangular profile as viewed in a direction from either of the side plates.

10. An electronic device, comprising:
    a circuit board having a plurality of sockets formed thereon;
    a plurality of electronic components respectively coupled to the sockets of the circuit board; and
    a fan duct covering the electronic components, the fan duct comprising a top plate over the electronic components, two side plates extending downward from opposite sides of the top plate and connected to the circuit board, and a plurality of guiding plates extending downward from the top plate towards the electronic components, an air inlet and an air outlet being defined at another two opposite sides of the top plate, the guiding plates configured for guiding air flowing horizontally across the electronic components toward bottoms of the electronic components, each of the guiding plates comprising a guiding face facing the air inlet and a single, smoothly continuous rear face facing the air outlet, the guiding face obliquely oriented with respect to the top plate, and the rear face extending aslant directly from the top plate and intersecting the guiding face at a bottom of the guiding plate.

11. The electronic device of claim 10, wherein the guiding plates are located adjacent to the air outlet.

12. The electronic device of claim 11, wherein the guiding plates are parallel to and evenly distributed between the side plates.

13. The electronic device of claim 11, wherein an angle formed between the guiding face and the top plate is between 90° and 180°.

14. The electronic device of claim 10, wherein the guiding face is rectangular and planar.

15. The electronic device of claim 10, wherein the guiding face is concave.

16. The electronic device of claim 10, wherein the guiding face is convex.

17. The electronic device of claim 10, wherein the electronic components are parallel to and spaced from each other, a channel is defined between each two neighboring electronic components, and each of the guiding plates extends into one of the channels.

18. The electronic device of claim 17, wherein a height of a portion of said each of the guiding plates extending into the channel is approximately ⅓ to approximately ½ of a height of a corresponding electronic component.

19. The electronic device of claim 18, wherein the electronic components are memory cards.

* * * * *